(12) United States Patent
Gothelid et al.

(10) Patent No.: US 10,640,863 B2
(45) Date of Patent: May 5, 2020

(54) COATED CUTTING TOOL

(71) Applicant: SANDVIK INTELECTUAL PROPERTY AB, Sandviken (SE)

(72) Inventors: Emmanuelle Gothelid, Stockholm (SE); Marie Pettersson, Bandhagen (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 174 days.

(21) Appl. No.: 15/744,176

(22) PCT Filed: Jul. 5, 2016

(86) PCT No.: PCT/EP2016/065801
§ 371 (c)(1),
(2) Date: Jan. 12, 2018

(87) PCT Pub. No.: WO2017/009101
PCT Pub. Date: Jan. 19, 2017

(65) Prior Publication Data
US 2018/0209031 A1    Jul. 26, 2018

(30) Foreign Application Priority Data
Jul. 13, 2015  (EP) ...................................  15176489

(51) Int. Cl.
| | |
|---|---|
| *B23B 27/14* | (2006.01) |
| *C23C 14/06* | (2006.01) |
| *C23C 14/32* | (2006.01) |
| *C23C 28/00* | (2006.01) |
| *C23C 28/04* | (2006.01) |
| *C23C 14/02* | (2006.01) |

(52) U.S. Cl.
CPC ........ *C23C 14/0641* (2013.01); *C23C 14/021* (2013.01); *C23C 14/325* (2013.01); *C23C 28/044* (2013.01); *C23C 28/42* (2013.01)

(58) Field of Classification Search
USPC .......... 51/307, 309; 428/325, 336, 697, 698, 428/699; 501/87, 93
See application file for complete search history.

(56) References Cited

U.S. PATENT DOCUMENTS 6,824,601 B2 * 11/2004 Yamamoto .......... C23C 14/0641
                                                                428/699
2006/0269788 A1 * 11/2006 Ishikawa ................. C23C 14/06
                                                                428/698

(Continued)

FOREIGN PATENT DOCUMENTS

| EP | 2008743 B1 | 12/2008 |
| EP | 2883637 A1 | 6/2015 |

(Continued)

*Primary Examiner* — Archene A Turner
(74) *Attorney, Agent, or Firm* — Corinne R. Gorski

(57) ABSTRACT

The present disclosure relates to a coated cutting tool having a cemented carbide body and a 0.5-10 μm (Ti,Al,Cr)N nanolayered PVD coating with an average composition TiaAlbCrcN, wherein a=0.25-0.7, b=0.3-0.7 and c=0.01-0.2, a+b+c=1. The cemented carbide body has a composition of 5-18 wt % Co, 0.1-2.5 wt % Cr, 0-10 wt % carbides or carbonitrides of metals from groups 4, 5 and 6 in the periodic table of elements, and the balance WC.

14 Claims, 1 Drawing Sheet

(56) References Cited

U.S. PATENT DOCUMENTS

| | | | |
|---|---|---|---|
| 2008/0295658 A1* | 12/2008 | Donnadieu | C04B 35/581 428/336 |
| 2008/0299383 A1* | 12/2008 | Martensson | C22C 29/08 428/323 |
| 2009/0155559 A1 | 6/2009 | Fengting et al. | |
| 2011/0183832 A1* | 7/2011 | Norgren | C22C 29/005 501/93 |
| 2015/0203956 A1* | 7/2015 | Asari | C23C 30/005 428/216 |

FOREIGN PATENT DOCUMENTS

| | | |
|---|---|---|
| JP | 2003340608 A | 12/2003 |
| RU | 2478731 C1 | 4/2013 |
| RU | 2487781 C2 | 7/2013 |

\* cited by examiner

US 10,640,863 B2

1

COATED CUTTING TOOL

RELATED APPLICATION DATA

This application is a § 371 National Stage Application of PCT International Application No. PCT/EP2016/065801 filed Jul. 5, 2016 claiming priority to _EP Application No. 15176489.1 filed Jul. 13, 2015.

TECHNICAL FIELD

The present invention relates to a coated cutting tool. The coated cutting tool comprises a cemented carbide body and a PVD coating.

BACKGROUND

PVD coated cutting tools where a PVD coating is deposited on a cemented carbide substrate are well known in the art.

Nanolayered PVD coatings composed of a multiple of sublayers of different compositions have been used since a long time. These coatings are made of different sublayers A, B, C . . . commonly being metal nitrides that have been repeatedly deposited in a manner, e.g., A/B/A/B/A . . . or A/B/C/A/B/C/A . . . . The individual sublayers normally have a thickness of between 3 and 100 nm, many times between 5 and 25 nm which means that the total number of sublayers for each micrometer thickness of the nanolayered PVD coating are large. The metals may belong to groups 4, 5 and 6 in the periodic table of elements such as Ti, Zr, V, and Cr, commonly also together with Al and Si. Specific examples are for example nanolayered coatings where the individual layers are TiAlN and TiN, or different TiAlN sublayers having different Ti/Al ratios.

Cemented carbide substrates in cutting tools may have various contents of binder phase, normally Co. Beside the main component WC, other hard constituents such as carbides of Ti, Ta and Nb may in some cases also be present. Additions of elements like Cr may also have been made. The specific combination of components in the cemented carbide, as well as the specific sintering process, gives the actual microstructure and affects properties such as toughness and hardness.

Milling of steel is an important metal cutting operation in the industry. ISO P materials are in particular widely used. Milling operations are demanding metal cutting operations which are typically intermittent in nature. The thermal and mechanical load will vary over time. The former induces thermal tensions which may lead to so-called thermal cracks in the coatings, while the later may cause chipping in the cutting edge due to fatigue. Thus, common wear types in milling are cracking and chipping, i.e., small fragments of the cutting edge loosening from the rest of the substrate. Both may be enhanced should flaking of the coating at an early stage. Increasing the thermal crack resistance, edge toughness and flaking resistance are thus of great importance to increase tool lifetime. PVD coatings are commonly used in cutting tools for milling operations. The use of a nanolayered PVD coating in general instead of a homogeneous PVD coating may reduce the propagation of cracks through a coating. Also, a nanolayered coating specifically comprising harder sublayers interlaid with softer sublayers may further reduce the risk of chipping through shock absorption by the softer sublayers.

For milling applications of ISO P steels there is thus a need for a coated cutting tool which shows an overall

2 combination of good edge line toughness (resistance to chipping in the edge line), good thermal crack resistance, good flaking resistance and good chemical and abrasive wear resistance.

In contrast to milling, turning is a continuous machining operation. Heat resistant super alloys (HRSA) and titanium, i.e., ISO S materials, are important materials in. e.g. the aerospace industry. Machining ISO S materials is challenging due to the properties of the workpiece material. These materials are hard and smearing. Machining them generate a lot of heat and promote wear mechanisms such as adhesive, abrasive and chemical wear. Notch formation, flaking and chipping are common reasons for reaching tool life. For turning applications of ISO S materials there is thus a need for a coated cutting tool which shows an overall combination of good edge line toughness (resistance to chipping in the edge line), abrasive and chemical wear resistance and good flaking resistance. Thanks to their toughness, and hot hardness, nanocrystalline high Al content PVD coatings are extensively used for machining ISO S materials.

EP 1 795 628 A1 discloses a coated cutting tool for milling of steel alloys and stainless steels where a cemented carbide substrate containing 8-11 wt % Co and 0.1-0.5 wt % Cr is coated with a nanolayered PVD coating A/B/A/B/ A . . . wherein the sublayers A and B consists of $Al_xTi_{1-x}N$ and $Ti_yAl_{1-y}N$, x=0.4-0.7 and y=0.6-1, x<y.

EP 2 011 894 A1 discloses a coated cutting tool insert for parting, grooving and threading of steel and stainless steels comprising a cemented carbide substrate and a PVD coating comprising two (Ti,Al)N-layers with different Ti/Al ratios. In one embodiment the PVD coating is made of an inner aperiodic TiAlN lamella coating consisting of alternating layers of $Al_zTi_{1-z}N$ and $Al_vTi_{1-v}N$ where z=0.55-0.70 and v=0.35-0.53 and an outer (Ti,Al)N lamella coating consisting of alternating layers of $Al_mTi_{1-m}N$ and $Al_nTi_{1-n}N$ and $Al_kTi_{1-k}N$ where m=0-0.1, n=0.35-0.53 and k=0.55-0.70. The cemented carbide substrate comprises 7.5-10.5 wt % Co and 0.8-1.0 wt % Cr.

EP 2 008 743 A1 discloses a coated cutting tool insert for turning in heat resistant superalloys and stainless steels comprising a cemented carbide substrate and a PVD coating comprising an aperiodic (Ti,Al)N lamella coating with an average composition of 0.4-0.7. The individual lamellas have a composition $Al_xTi_{1-x}N$, where x=0.4-0.7, and $Ti_yAl_{1-y}N$, where y=0.6-1. The cemented carbide substrate comprises 5-8 wt % Co and 0.3-1.5 wt % Cr.

SUMMARY

It has now been provided a coated cutting tool having a (Ti,Al,Cr)N nanolayered PVD coating onto a Cr-containing cemented carbide substrate which is outperforming the previously known cutting tools in machining of ISO P materials when a high thermal crack resistance combined with a high edge toughness is required, like milling operations.

The coated cutting tool according to the invention is further outperforming the previously known cutting tools in machining of heat resistant super alloys (HRSA) and titanium, i.e., ISO S materials, when a high wear resistance combined with a high edge toughness is required like turning operations.

The coated cutting tool can be a coated cutting insert, such as a coated cutting insert for turning or a coated cutting insert for milling, or a coated cutting insert for drilling, or a coated cutting insert for threading, or a coated cutting insert for parting and grooving. The coated cutting tool can also be a coated solid carbide drill or endmill.

According to the present invention it is provided a coated cutting tool comprising a cemented carbide body and a PVD coating, the cemented carbide body has a composition of 5-18 wt % Co, 0.1-2.5 wt % Cr, 0-10 wt % carbides or carbonitrides, apart from WC, of one or more metals from groups 4, 5 and 6 in the periodic table of elements, and balance WC, the PVD coating is a (Ti,Al,Cr)N nanolayered PVD coating with an average composition $Ti_aAl_bCr_cN$, wherein a=0.25-0.7, b=0.3-0.7 and c=0.01-0.2, a+b+c=1, the PVD coating is a nanolayered PVD coating A/B/A/B/A . . . wherein the sublayers A and B consist of respectively A: $Ti_uAl_vCr_wN$, u=0.1-0.4, v=0.5-0.8, w=0.01-0.3, u+v+w=1, and B: $Ti_xAl_yCr_zN$, x=0.4-0.7, y=0.3-0.6, z=0-0.2, x+y+z=1, u<x and v>y, the thickness of the nanolayered PVD coating is 0.5-10 μm.

The foregoing summary, as well as the following detailed description of the embodiments, will be better understood when read in conjunction with the appended drawings. It should be understood that the embodiments depicted are not limited to the precise arrangements and instrumentalities shown.

BRIEF DESCRIPTIONS OF THE DRAWINGS

DETAILED DESCRIPTION

Figure 1:
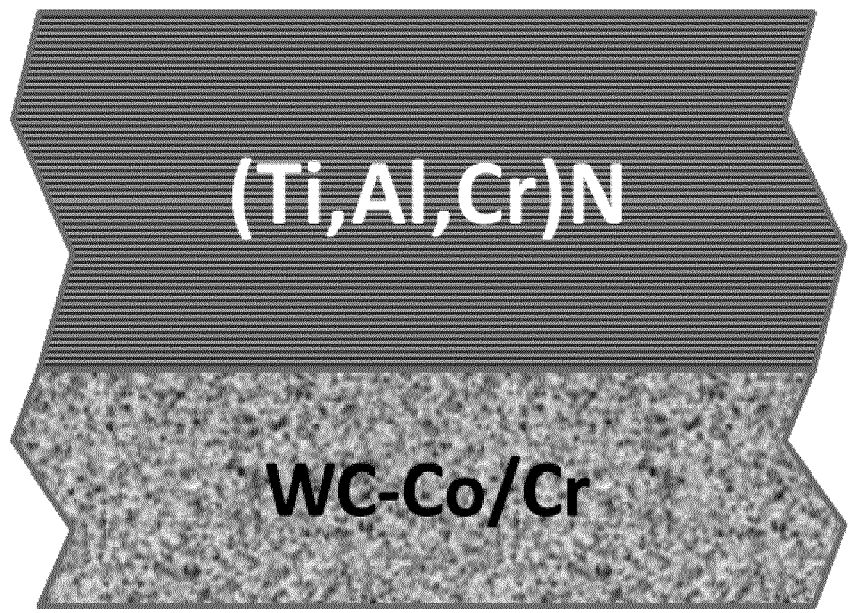
FIG. 1 illustrates the nanolayered (Ti,Al,Cr)N PVD coating deposited on a body.

A schematic image of the nanolayered (Ti,Al,Cr)N PVD coating deposited on a body is shown in FIG. 1.

In one embodiment, the cemented carbide body comprises 6-15 wt % Co.

In one embodiment, the cemented carbide body comprises 6-14 wt % Co.

In one embodiment, the cemented carbide body comprises 8-12 wt % Co.

In one embodiment, the cemented carbide body comprises 9-11 wt % Co.

In one embodiment, the cemented carbide body comprises 10-15 wt % Co.

In one embodiment, the cemented carbide body comprises 12-15 wt % Co.

In one embodiment, the cemented carbide body comprises 6-8 wt % Co.

In one embodiment, the cemented carbide body comprises 0.1-2.5 wt % Cr.

In one embodiment, the cemented carbide body comprises 0.2-2 wt % Cr.

In one embodiment, the cemented carbide body comprises 0.4-1.8 wt % Cr.

In one embodiment, the cemented carbide body comprises 0.6-1.6 wt % Cr.

In one embodiment, the cemented carbide body comprises 0.8-1.4 wt % Cr.

In one embodiment, the cemented carbide has a composition of 8-12 wt % Co, preferably 9-11 wt % Co, and 0.6-1.8 wt % Cr, preferably 0.8-1.6 wt % Cr, and balance WC. This is a preferred embodiment when the coated cutting tool is a coated cutting insert for milling of ISO P materials.

In one embodiment, the cemented carbide has a composition of 12-15 wt % Co, and 0.8-2 wt % Cr, preferably 1-1.8 wt % Cr, and balance WC. This is another preferred embodiment when the coated cutting tool is a coated cutting insert for milling of ISO P materials.

In one embodiment, the cemented carbide has a composition of 6-8 wt % Co and 0.4-1.2 wt % Cr, preferably 0.5-1 wt % Cr, and balance WC. This is a preferred embodiment when the coated cutting tool is a coated cutting insert for turning of ISO S materials.

The Cr/Co weight ratio in the cemented carbide body is suitably 0.01 to 0.2, or 0.02 to 0.19, or 0.03-0.18, or 0.04-0.16, or 0.05-0.15, or 0.06-0.14, or 0.07-0.13, or 0.08-0.12.

The cemented carbide body may further comprise additions of one or more of metals Me, being Ti, Ta, Nb, V and Zr, in an amount of 50-300 ppm by weight, or 100-200 ppm by weight.

The cemented carbide body may comprise 0-5 wt %, or 0-3 wt %, or 0-1 wt %, or 0-0.5 wt %, or 0-0.1 wt % carbides or carbonitrides of one or more metals from groups 4, 5 and 6 in the periodic table of elements, apart from WC.

The metals from groups 4, 5 and 6 in the periodic table of elements are suitably belonging to the group of Ti, Ta, Nb, V, Zr, Cr, W and Mo.

In one embodiment the cemented carbide body has substantially no precipitated phases in the Co binder phase except WC.

The cemented carbide may contain small amounts, <1 vol-%, or <0.5 vol-%, of precipitations of so-called eta-phase, or other impurities, without any detrimental effects.

The cemented carbide body suitably has an atomic percentage ratio Me/Co, i.e., (at-% Ti+at-% Ta+at-% Nb+at-% V+at-% Zr)/at-% Co, being lower than or equal to 0.014−(CW_Cr)*0.008 and higher than 0.0005, preferably higher than 0.0007, with Cw_Cr 0.75-0.95, preferably 0.80-0.92, where:

$$CW\_Cr = (\text{magnetic-\% Co} + 1.13 * \text{wt-\% Cr})/\text{wt-\% Co}.$$

The magnetic properties of cemented carbides are determined by the ferromagnetic properties of the Co binder phase, whereas the hard phases (WC etc.) are non-ferromagnetic. The contribution of the Co in the binder phase to the measured magnetic moment is always only a percentage of the (theoretical) magnetic moment of 100% pure Co. This can, for example, be due to that some metals in the cemented carbide composition, such as W and Cr, can dissolve in the Co binder phase during sintering and reduce the ferromagnetic properties of the Co binder phase compared to pure Co. Therefore, by the term magnetic-% Co is meant the magnetic moment measured in relation to the magnetic moment of pure Co.

The magnetic coercivity of the cemented carbide body is suitably 14-30 kA/m, or 16-29 kA/m, or 18-28 kA/m.

In one embodiment, the magnetic coercivity of the cemented carbide body is 25-29 kA/m.

In one embodiment, the magnetic coercivity of the cemented carbide body is 18-24 kA/m.

For coercivity measurements it is referred to standard DIN IEC 60404-7 (Determination the coercive field strength in an open magnetic circuit).

The grain size of the WC, d, in the cemented carbide body is suitably 0.20-0.80 μm, or 0.25-0.75 μm, or 0.30-0.70 μm, or 0.30-0.50 μm.

The grain size of the WC, d, is determined from the value of magnetic coercivity. The relationship between coercivity and grain size of WC is described, e.g., in Roebuck et al., Measurement Good Practice No. 20, National Physical Laboratory, ISSN 1368-6550, November 1999, Revised February 2009, Section 3.4.3, pages 19-20. For the purposes of this application the grain size of the WC, d, is determined according to formula (8) on page 20 in the above-mentioned literature: $K=(c_1+d_1 W_{Co})+(c_2+d_2 W_{Co})/d$. Re-arranging one gets:

$$d=(c_2+d_2 W_{Co})/(K-(c_1+d_1 W_{Co})), \text{ wherein}$$

d=WC grain size of the cemented carbide body, K=coercivity of the cemented carbide body in kA/m, herein measured according to standard DIN IEC 60404-7, $W_{Co}$=wt % Co in the cemented carbide body, $c_1=1.44$, $c_2=12.47$, $d_1=0.04$, and $d_2=-0.37$.

The average composition $Ti_a Al_b Cr_c N$ of the nanolayered PVD coating has preferably a=0.28-0.55, most preferably a=0.3-0.45, preferably b=0.4-0.65, most preferably b=0.5-0.6, and preferably c=0.02-0.15, most preferably c=0.03-0.12, a+b+c=1.

For the sublayer A of the nanolayered PVD coating being $Ti_u Al_v Cr_w N$, u is suitably 0.15-0.35, preferably 0.2-0.3, v is suitably 0.55-0.75, preferably 0.6-0.7, w=0.02-0.2, preferably 0.05-0.15, u+v+w=1.

For the sublayer B of the nanolayered PVD coating being $Ti_x Al_y Cr_z N$, x is suitably 0.45-0.6, preferably 0.45-0.55, y is suitably 0.35-0.55, z=0-0.15, preferably 0-0.10, most preferably 0-0.05, x+y+z=1.

In one embodiment y is 0.35-0.45.

In one embodiment y is 0.45-0-55.

In one embodiment z is 0.

In one embodiment, the nanolayered PVD coating has sublayers A and B consisting of respectively:

A: $Ti_u Al_v Cr_w N$, u=0.15-0.35, v=0.55-0.75, w=0.02-0.2, and

B: $Ti_x Al_y Cr_z N$, x=0.45-0.6, y=0.35-0.55, z=0-0.15.

The Ti/Al atomic ratio of the average composition $Ti_a Al_b Cr_c N$ of the nanolayered PVD coating, i.e., a/b in the average composition $Ti_a Al_b Cr_c N$ of the nanolayered PVD coating, is suitably 0.4-1.2, preferably 0.4-1.0, more preferably 0.4-0.85, even more preferably 0.5-0.8, most preferably 0.6-0.75.

The nanolayered PVD coating can be aperiodic or periodic depending on, e.g., the design of the PVD coating apparatus, the movement of the blanks to be coated in relation to the targets, etc.

In one embodiment the nanolayered PVD coating is an aperiodic coating.

In one embodiment the nanolayered PVD coating is a periodic coating.

The thickness of each nanolayer A and B is 3-100 nm, or 3-75 nm, or 5-50 nm, or 5-25 nm.

The total number of sublayers A and B for each μm of the nanolayered PVD coating are suitably 15-200, or 25-150, or 50-125.

The thickness of the nanolayered PVD coating (on either the rake face or flank face, or both, of the coated cutting tool) is 0.5-10 μm, or 1-8 μm, or 1-6 μm, or 2-6 μm.

In one embodiment, the thickness of the nanolayered PVD coating (on either the rake face or flank face, or both, of the coated cutting tool) is 3-5 μm. This is a preferred embodiment when the coated cutting tool is a coated cutting insert for milling of ISO P materials.

In one embodiment, the thickness (on either the rake face or flank face, or both, of the coated cutting tool) of the nanolayered PVD coating is 1-4 μm, preferably 1.5-3.5 μm. This is a preferred embodiment when the coated cutting tool is a coated cutting insert for turning of ISO S materials.

The thickness of the nanolayered PVD coating is measured both within an area on the rake face 200 μm from the middle of the edge, and within an area on the flank face 200 μm from the middle of the edge, by, e.g., light optical microscopy. On each of the two areas, layer thicknesses at three places of the coating were measured and averages calculated.

Further layers on top of the nanolayered PVD coating may be present but their total thickness should not exceed 50%, preferably not exceed 25%, of the thickness of the nanolayered PVD coating. Among possible further layers an outermost 0.1-1 μm thick PVD layer of (Ti,Al)N, e.g., for colouring purposes, can be present. Furthermore, among possible further layers an innermost an innermost 0.1-0.5 μm thick PVD layer of, e.g., TiN, for adhesion purposes, can be present.

The (Ti,Al,Cr)N nanolayered coating may further comprise one or more further metal elements Me in small amounts not substantially altering the properties of the claimed (Ti,Al,Cr)N coating, e.g., resulting from impurities in the targets used in the PVD deposition process, e.g., less than 1 at %, or less than 0.5 at %, or less than 0.3 at %, or less than 0.1 at %, of the sum of Ti+Al+Cr+Me in the nanolayered coating. Me is one or more of Zr, Hf, V, Nb, Ta, Mo, Fe, W and Si.

The nanolayered PVD coating can be deposited by cathodic arc evaporation in a vacuum chamber. Targets of a suitable composition are provided and mounted in the vacuum chamber in order to obtain the desired nanolayered PVD coating. DC bias is suitably used and other process parameters such as N2 flow and pressure, bias voltage, anode current, temperature and time, are to be adjusted as is known to a skilled person in the field of PVD.

The bias voltage is suitably 30-100 V, or 40-90 V, or 50-80 V.

The temperature during deposition of the nanolayered PVD coating is suitably 250-750° C., preferably 300-600° C., most preferably 350-500° C.

The cemented carbide body of the coated cutting tool, i.e. after deposition of the PVD coating, has suitably a residual stress $RS_{cc}$ between −1 and −4 GPa, or between −1.2 and −3 GPa. Since the values are negative the residual stress is compressive.

The PVD coating has suitably a residual stress $RS_{PVD}$ between −0.5 and −4.5 GPa, or between −1.5 and −3.5 GPa. Since the values are negative the residual stress is compressive.

The difference between the residual stress of the cemented carbide body $RS_{cc}$ and the residual stress of the PVD coating $RS_{PVD}$ is such that the difference in absolute value $|RS_{cc}-RS_{PVD}|$ is suitably from 0 to 1.5 GPa, or from 0 to 1 GPa, or from 0 to 0.8 GPa, or from 0 to 0.6 GPa, or from 0 to 0.4 GPa.

The residual stress has been evaluated by X-ray diffraction measurements using the well-known $\sin^2\psi$ method as described by I. C. Noyan, J. B. Cohen, Residual Stress Measurement by Diffraction and Interpretation, Springer-Verlag, New York, 1987 (pp 117-130). See also for example V Hauk, Structural and Residual Stress analysis by Nondestructive Methods, Elsevier, Amsterdam, 1997. For the PVD coating, the measurements are performed using CuKα-radiation on the (Ti,Al,Cr)N (200) reflection. For the cemented carbide body, the measurements are performed using CuKα-radiation on the WC (300) reflection. The side-inclination technique (ψ-geometry) has been used with six to eleven, preferably eight, ψ-angles, equidistant within a selected $\sin^2\psi$-range. An equidistant distribution of φ-angles within a φ-sector of 90° is preferred. To confirm a biaxial stress state, the sample shall be rotated for φ=0 and 90° while tilted in ψ. It is recommended to investigate the possible presence of shear stresses and therefore both negative and positive ψ-angles shall be measured. In the case of an Euler ¼-cradle this is accomplished by measuring the sample also at ϕ=180 and 270° for the different ψ-angles. The measurement shall be performed on an as flat surface as possible, preferably on a flank side of an insert. For the calculations of the residual stress values the Possion's ratio, ν=0.33 and the Young's modulus, E=350 GPa are to be used for the PVD coating, and the Possion's ratio, ν=0.19 and the Young's modulus, E=650 GPa are to be used for the cemented carbide body. The data is evaluated using commercially available software such as DIFFRAC$^{Plus}$ Stress32 v. 7.7 from Bruker AXS preferably locating the (Ti,Al,Cr)N (200) and WC (300) reflections respectively, by the Pseudo-Voigt-Fit function. The total stress value is calculated as the average of the obtained biaxial stresses.

EXAMPLES

Example 1 (Invention)

Cemented carbide milling blanks (of geometry R390-1108T3M-PM) were provided having a composition of 10.0 wt % Co, 1.0 wt % Cr, 0.013 wt % Ti, 0.010 wt % Ta and balance WC. Thus, the Cr/Co weight ratio was 0.10. The blanks had been made from pressed powder and sintered. Their magnetic coercivity value was 21.5 kA/m, measured in the FÖRSTER KOERZIMAT CS 1.096 from Foerster Instruments Inc. according to DIN IEC 60404-7, and they had a magnetic-% Co value of 7.9 corresponding to a CW_Cr ratio of 0.90. The grain size of the WC, determined from coercivity as defined earlier in the description, was 0.45 μm.

Figure 2:
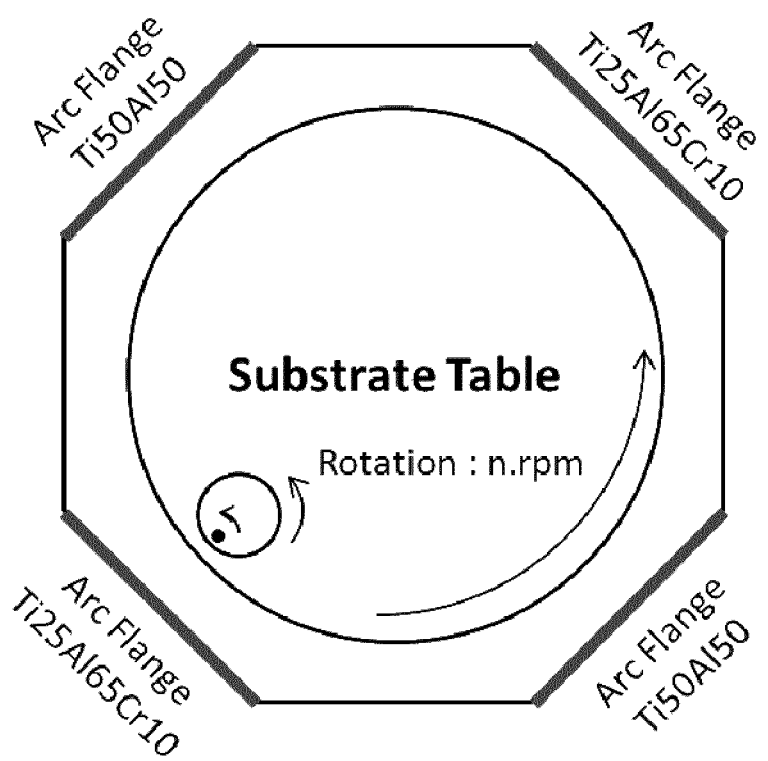
FIG. 2 is a top view of a device used to deposit the coating.

The nanolayered PVD coating was deposited by cathodic arc evaporation in a vacuum chamber. The vacuum chamber comprised four arc flanges. Targets of $Ti_{50}Al_{50}$ composition were mounted in two of the flanges opposite each other. Furthermore, targets of $Ti_{25}Al_{65}Cr_{10}$ composition were mounted in the remaining two flanges opposite each other. See FIG. 2.

The uncoated blanks were mounted on pins that undergo a three-fold rotation in the PVD chamber.

A substrate table was provided including a number of trees having places for blanks pins on both upper and lower levels.

At first, an Ar-plasma etching step was made.

In the subsequent coating step the nanolayered (Ti,Al,Cr)N PVD coating was deposited. The process parameters used are described in Table 2. A suitable arc current was chosen to achieve the desired deposition rate.

90 min coating time resulted in a 2.7 μm thick coating on the rake face and 3.6 μm on the flank face (on control blanks).

TABLE 2

| N2 Pressure | Bias Voltage | Bias type | Time | Table rot | Temp. |
|---|---|---|---|---|---|
| 4 · 10$^{-2}$ mbar | 70 V | DC | 75 min | 3 rpm | 550° C. |

The coating consisted of a binary A+B+A+B+ . . . aperiodic multilayer, i.e. layers with a non-repetitive thickness.

The coating had an average composition $Ti_{0.38}Al_{0.56}Cr_{0.06}N$ measured by EDS (Energy Dispersive Spectroscopy) in the equipment Hitachi S-4300 FEG-SEM.

The sublayer thicknesses for A and B were in the range from about 10 to about 25 nm. In average about 15 nm. The number of sublayers A and B for each μm was about 70.

Example 2 (Invention)

A coated cutting tool was made according to the process described in Example 1 using the cemented carbide milling blanks of the same geometry and composition but where targets of $Ti_{50}Al_{40}Cr_{10}$ and $Ti_{25}Al_{65}Cr_{10}$ were used instead.

The coating consisted of a binary A+B+A+B+ . . . aperiodic multilayer, i.e. layers with a non-repetitive thickness, but with an average A+B layer thickness of 60-120 nm.

The coating had an average composition $Ti_{0.37}Al_{0.53}Cr_{0.10}N$.

The coating thickness was measured to be 2.9 μm on the rake face and 3.8 μm on the flank face (on control blanks).

Example 3 (Invention)

A coated cutting tool was made according to the process described in Example 1 using the cemented carbide milling blanks of the same geometry and composition but where the coating temperature was decreased to 500° C. and bias voltage increased to 70V.

The coating thickness was about 2.5 μm on the rake face and 3.5 μm on the flank face (on control blanks).

The coating had an average composition $Ti_{0.38}Al_{0.56}Cr_{0.06}N$ measured by EDS (Energy Dispersive Spectroscopy) in the equipment Hitachi S-4300 FEG-SEM.

The residual stress for the coated cemented carbide body and the PVD coating were measured. The results are shown in Table 3.

TABLE 3

| | Cemented carbide body (after deposition of the coating) | | PVD coating | |
|---|---|---|---|---|
| Sample No. | ϕ = 0° | ϕ = 90° | ϕ = 0° | ϕ = 90° |
| Example 3 (invention) | −2.1 GPa | −2.2 GPa | −2.5 GPa | −2.4 GPa |

Example 4 (Comparative)

A coated cutting tool was made according to the process described in Example 1 using the cemented carbide milling blanks of the same geometry and composition but where targets of $Ti_{75}Al_{25}$ and $Ti_{40}Al_{60}$ were used instead.

The coating consisted of a binary A+B+A+B+ . . . aperiodic multilayer, i.e. layers with a non-repetitive thickness, but with an average A+B layer thickness of 60-120 nm.

The coating had an average composition $Ti_{0.60}Al_{0.40}N$.

The coating thickness was measured to be 2.3 μm on the rake face and 3.3 μm on the flank face (on control blanks).

Example 5 (Comparative)

A coated cutting tool was made according to the process described in Example 1 using the cemented carbide milling blanks of the same geometry and composition but where targets of the same composition, $Ti_{50}Al_{40}Cr_{10}$, were used.

The coating consisted of a monolithic layer of $Ti_{50}Al_{40}Cr_{10}N$.

The coating thickness was measured to be 2.3 μm on the rake face and 3.5 μm on the flank face (on control blanks).

Example 6 (Comparative)

A coated cutting tool was made according to the process described in Example 1 using the cemented carbide milling blanks of the same geometry and composition but where targets of the same composition, $Ti_{25}Al_{65}Cr_{10}$, were used.

The coating consisted of a monolithic layer of $Ti_{25}Al_{65}Cr_{10}N$.

The coating thickness was measured to be 2.7 μm on the rake face and 3.5 μm on the flank face (on control blanks).
Explanations to Terms Used in Examples 7 and 11:

The following expressions/terms are commonly used in metal cutting, but nevertheless explained in the table below:
Vc (m/min): cutting speed in meters per minute
fz (mm/tooth): feed rate in millimeter per tooth (in milling)
fn (mm/rev) feed rate per revolution (in turning)
z: (number) number of teeth in the cutter
$a_e$ (mm): radial depth of cut in millimeter
$a_p$ (mm): axial depth of cut in millimeter

Example 7

Inserts from Examples 1-6 were tested for thermal crack resistance, edge line toughness, flaking, and wear resistance, which are the main wear types in ISO-P milling.
Thermal Crack Resistance:
Work piece material: Toolox33, PK158 600×200×100 mm, P2.5.Z.HT
z=1
$V_c$=250 m/min
$f_z$=0.20 mm
$a_e$=12.5 mm
$a_p$=3.0
with cutting fluid The cut off criteria is reached when the cracks have resulted in chipping of the edge >0.30 mm. Tool life is presented as the number of cut entrances in order to achieve these criteria.
Edge Line Toughness:
Work piece material: Dievar unhardened, P3. 0.Z.AN,
z=1
$V_c$=200 m/min
$f_z$=0.20 mm
$a_e$=12 mm
$a_p$=3.0
length of cut=12 mm
without cutting fluid The cut-off criteria are chipping of at least 0.5 mm of the edge line or a measured depth of 0.2 mm at either the flank- or the rake phase. Tool life is presented as the number of cut entrances in order to achieve these criteria.
Flaking Test:

The test is run in a low carbon steel which in combination with cutting fluid cause the coating to flake at the rake phase.
Work piece material: SS2244-05, PL121 600×200×20 mm, z=1
$V_c$=150 m/min
$f_z$=0.15 mm
$a_e$=12.5 mm
$a_p$=1.0
with cutting fluid The flaked area is measured after 10 cuts (7 minutes in cut).
Wear Resistance:

The wear resistance test evaluates the resistance towards continuous flank- and crater wear.
Work piece material: Toolox33, Hardness 300HB, PK158 600×200×100 mm, P2.5.Z.HT,
z=1
$V_c$=220 m/min
$f_z$=0.15 mm
$a_e$=50 mm
$a_p$=2.0
without cutting fluid The cut-off criteria for tool life is a flank wear of 0.13 mm.
The results are presented in Table 3 below. The level of performance is noted after the actual values (++, +, 0, −).

TABLE 3

| | PVD coating | Thermal crack resistance | Edge line toughness | Flaking test (flaked area, mm$^2$) | Tool life (min) |
|---|---|---|---|---|---|
| Ex. 1 (invention) | $Ti_{0.38}Al_{0.56}Cr_{0.06}N$ nano-layered | 22 (+) | 35 (0) | 0.04 (+) | 45 (+) |
| Ex. 2 (invention) | $Ti_{0.37}Al_{0.53}Cr_{0.10}N$ nano-layered | 18 (+) | 35 (0) | 0.04 (+) | 41 (+) |
| Ex. 3 (invention) | $Ti_{0.38}Al_{0.56}Cr_{0.06}N$ nano-layered | 14 (0) | 60 (++) | 0.03 (+) | 40 (+) |
| Ex. 4 (comparative) | $Ti_{0.60}Al_{0.40}N$ nano-layered | 11 (−) | 61 (+) | 0.04 (+) | 45 (+) |
| Ex. 5 (comparative) | $Ti_{50}Al_{40}Cr_{10}$ monolithic | 11 (−) | 72 (++) | 0.03 (+) | 36 (+) |
| Ex. 6 (comparative) | $Ti_{25}Al_{65}Cr_{10}$ monolithic | 12 (−) | 23 (−) | 0.13 (−) | 25 (−) |

It is concluded that the samples according to the invention outperforms the comparative samples in crack resistance. At the same time the results from edge line toughness, flaking and wear resistance are satisfactory or even excellent.

Example 8 (Invention)

Cemented carbide turning blanks (of geometry CNMG 120408-MM) and milling blanks (of geometry R245-12T3MPM1) were provided having a composition of 10.0 wt % Co, 0.039 wt % Cr, and balance WC. Thus, the Cr/Co weight ratio was 0.039. The blanks had been made from pressed powder and sintered. Their magnetic coercivity value was 20.45 kA/m, measured in the FÖRSTER KOERZIMAT CS 1.096 from Foerster Instruments Inc. according to DIN IEC 60404-7, and they had a magnetic-% Co value of 8.45 corresponding to a CW_Cr ratio of 0.89. The grain size of the WC, determined from coercivity as defined earlier in the description, was 0.47 μm.

A nanolayered (Ti,Al,Cr)N PVD coating was provided using the same process steps and parameters as in Example 1 but where the two different set of targets used for each PVD coating were the ones seen in Table 4 below.

TABLE 4

| Sample No. | First targets composition | Second targets composition | A/B in nanolayer |
|---|---|---|---|
| 1 | $Ti_{33}Al_{67}$ | $Ti_{25}Al_{65}Cr_{10}$ | $Ti_{33}Al_{67}N/Ti_{25}Al_{65}Cr_{10}N$ |
| 2 | $Ti_{40}Al_{60}$ | $Ti_{25}Al_{65}Cr_{10}$ | $Ti_{40}Al_{60}N/Ti_{25}Al_{65}Cr_{10}N$ |
| 3 | $Ti_{50}Al_{50}$ | $Ti_{25}Al_{65}Cr_{10}$ | $Ti_{50}Al_{50}N/Ti_{25}Al_{65}Cr_{10}N$ |
| 4 | $Ti_{60}Al_{40}$ | $Ti_{25}Al_{65}Cr_{10}$ | $Ti_{60}Al_{40}N/Ti_{25}Al_{65}Cr_{10}N$ |
| 5 | $Ti_{75}Al_{25}$ | $Ti_{25}Al_{65}Cr_{10}$ | $Ti_{75}Al_{25}N/Ti_{25}Al_{65}Cr_{10}N$ |

The coating on each sample consisted of a binary A+B+A+B+ . . . aperiodic multilayer, i.e. layers with a non-repetitive thickness.

The average composition of each nanolayered PVD coating was estimated through the targets composition, giving the Ti/Al ratio, and is seen in Table 5. The thicknesses of each nanolayered PVD coating was measured and is seen in Table 5.

Three tests were performed in order to evaluate the performances of the coatings in Flank wear resistance—continuous abrasive wear on the clearance side of the inserts.

Crater wear resistance—continuous wear on the rake side of the inserts

Comb crack resistance—discontinuous wear—resistance to thermal intermittence

Flank Wear Test:
Longitudinal turning
Work piece material: Sverker 21 (tool steel), Hardness ~210HB, D=180, L=700 mm,
$V_c$=125 m/min
$f_n$=0.072 mm/rev
$a_p$=2 mm
without cutting fluid The cut-off criteria for tool life is a flank wear VB of 0.15 mm.

Crater Wear Test:
Longitudinal turning
Work piece material: Ovako 825B, ball bearing steel. Hot rolled and annealed, Hardness ~200HB, D=160, L=700 mm,
$V_c$=160 m/min
$f_n$=0.3 mm/rev
$a_p$=2 mm
with cutting fluid The criteria for end of tool life is a crater area of 0.8 mm².

Comb Crack Resistance:
Operation: Face milling
Tool holder: R245-080027-12M, Dc=80 mm
Work piece material: Toolox 33 (tool steel), L=600 mm, I=200 mm, h=100 mm,
Insert type: R245-12T3M-PM1
Cutting speed $V_c$=320 m/min
Feed rate $f_z$=0.3 mm/rev
Depth of cut $a_p$=2 mm
Radial engagement $a_e$=15 mm
with cutting fluid The criteria for end of tool life is a max. chipped height VB>0.3 mm.

See results in Table 5 below.

TABLE 5

| Sample No. | Estimated average composition of the PVD coating | Ti/Al ratio in the PVD coating | Thickness of PVD coating on flank/rake (μm) | Flank wear resistance, tool life (min) | Crater wear resistance, tool life (min) | Thermal crack resistance |
|---|---|---|---|---|---|---|
| 1 | $Ti_{0.29}Al_{0.66}Cr_{0.05}N$ | 0.44 | 4.4/3.1 | 13.0 | 3.2 | 8.8 |
| 2 | $Ti_{0.33}Al_{0.62}Cr_{0.05}N$ | 0.53 | 4.5/3.3 | 21.0 | 3.5 | 11.5 |
| 3 | $Ti_{0.38}Al_{0.57}Cr_{0.05}N$ | 0.67 | 3.4/2.7 | 16.0 | 5.7 | 13.3 |
| 4 | $Ti_{0.43}Al_{0.52}Cr_{0.05}N$ | 0.83 | 3.4/2.6 | 11.3 | 6.6 | 13.8 |
| 5 | $Ti_{0.50}Al_{0.45}Cr_{0.05}N$ | 1.11 | 3.8/2.8 | 8.0 | 6.3 | 11.8 |

It is concluded that the overall combination of flank wear, crater wear and thermal crack resistance for all samples is on an acceptable level. However, ranges of Ti/Al ratio giving overall excellent performance can be seen.

Example 9 (Invention)

Cemented carbide turning blanks (of geometry CNMG 120408-SM) were provided having a composition of 7 wt % Co, 0.7 wt % Cr, 0.013 wt % Ti, 0.010 wt % Ta and balance WC. Thus, the Cr/Co weight ratio was 0.10. The blanks had been made from pressed powder and sintered. Their magnetic coercivity value was 27.0 kA/m, measured in the FÖRSTER KOERZIMAT CS 1.096 from Foerster Instruments Inc. according to DIN IEC 60404-7, and they had a magnetic-% Co value of 5.1 corresponding to a CW_Cr ratio of 0.84. The grain size of the WC, determined from coercivity as defined earlier in the description, was 0.39 μm.

A nanolayered (Ti,Al,Cr)N PVD coating was provided using the same targets, process steps and process parameters as in Example 1, expect for a shorter deposition time giving a thinner coating.

The coating consisted of a binary A+B+A+B+ . . . aperiodic multilayer, i.e. layers with a non-repetitive thickness, but with an average A+B layer thickness of 60-120 nm.

The thickness of the nanolayered PVD coating was measured to 2.0 μm on the flank face.

The coating had an average composition $Ti_{0.38}Al_{0.56}Cr_{0.06}N$.

Example 10 (Comparative)

Cemented carbide turning blanks (of geometry CNMG 120408-SM) were provided having a composition of 6 wt %

Co, 0.22 wt % Ta, 0.14 wt % Nb, and balance WC. Thus, no Cr was present in the cemented carbide. The blanks had been made from pressed powder and sintered. Their magnetic coercivity value was 21.8 kA/m, measured in the FÖRSTER KOERZIMAT CS 1.096 from Foerster Instruments Inc. according to DIN IEC 60404-7, and they had a magnetic-% Co value of 5.4. The grain size of the WC, determined from coercivity as defined earlier in the description, was 0.51 µm.

A nanolayered (Ti,Al,Cr)N PVD coating was provided using the same targets, process steps and process parameters as in Example 1, expect for a shorter deposition time giving a thinner coating.

The coating consisted of a binary A+B+A+B+ . . . aperiodic multilayer, i.e. layers with a non-repetitive thickness, but with an average A+B layer thickness of 60-120 nm.

The thickness of the nanolayered PVD coating was measured to 2.0 µm on the flank face.

The coating had an average composition $Ti_{0.38}Al_{0.56}Cr_{0.06}N$.

Example 11

Inserts from Examples 9-10 were tested for wear resistance in turning.
Wear Resistance:
The wear resistance test evaluates the resistance towards continuous flank- and crater wear.
Work piece material: Inconel718: austenitic nickel-chromium-based superalloy, aged, Hardness ~450HB
Longitudinal turning
Three different combinations of $V_c$ and $f_n$:
1. $V_c$=50 m/min, $f_n$=0.2 mm/rev
2. $V_c$=70 m/min, $f_n$=0.2 mm/rev
3. $V_c$=50 m/min, $f_n$=0.3 mm/rev
$a_p$=1.5 mm
with cutting fluid
The cut-off criteria for tool life is $VB_{max}$/Notch/PD≥0.3 mm on main cutting edge or ≥0.25 mm on secondary cutting edge

TABLE 6

| | Tool life* (min), Vc 50 m/min fn = 0.2 mm/rev | Tool life* (min), Vc 70 m/min fn = 0.2 mm/rev | Tool life* (min), Vc 50 m/min, fn = 0.3 mm/rev |
|---|---|---|---|
| Example 9 (invention) | 10 | 4.8 | 7.5 |
| Example 10 (comparative) | 5.2 | 3 | 4 |

*minutes to $VB_{max}$/Notch/PD ≥0.3 mm on main cutting edge or ≥0.25 mm on secondary cutting edge It is concluded that the sample according to the invention outperforms the comparative samples in tool life.

Although the present embodiment(s) has been described in relation to particular aspects thereof, many other variations and modifications and other uses will become apparent to those skilled in the art. It is preferred therefore, that the present embodiment(s) be limited not by the specific disclosure herein, but only by the appended claims.

The invention claimed is:
1. A coated cutting tool comprising:
a cemented carbide body, the cemented carbide body having a composition of 5-18 wt % Co, 0.1-2.5 wt % Cr, 0-10 wt % carbides or carbonitrides, apart from WC, of metals from groups 4, 5 and 6 in the periodic table of elements, and a balance of WC; and
a PVD coating, the PVD coating being a (Ti,Al,Cr)N nanolayered PVD coating with an average composition $Ti_aAl_bCr_cN$, wherein a=0.25-0.7, b=0.3-0.7 and c=0.01-0.2, a+b+c=1, the PVD coating being a nanolayered PVD coating A/B/A/B/A . . . having sublayers A and B comprising A: $Ti_uAl_vCr_wN$, u=0.1-0.4, v=0.5-0.8, w=0.01-0.3, u+v+w=1, and B: $Ti_xAl_yCr_zN$, x=0.4-0.7, y=0.3-0.6, z=0-0.05, x+y+z=1, u<x and v>y, a thickness of the nanolayered PVD coating being 0.5-10 µm.
2. The coated cutting tool according to claim 1, wherein the sublayers A and B comprise:
A: $Ti_uAl_vCr_wN$, u=0.15-0.35, v=0.55-0.75, w=0.02-0.2, and
B: $Ti_xAl_yCr_zN$, x=0.45-0.6, y=0.35-0.55, z=0-0.05.
3. The coated cutting tool according to claim 1, wherein a Ti/Al atomic ratio of the average composition $Ti_aAl_bCr_cN$ of the nanolayered PVD coating is 0.5-0.75.
4. The coated cutting tool according to claim 1, wherein a total numbers of sublayers A and B for each µm of the nanolayered PVD coating is 25-150.
5. The coated cutting tool according to claim 1, wherein the cemented carbide body has a composition of 6-14 wt % Co.
6. The coated cutting tool according to claim 1, wherein the cemented carbide body has a composition of 0.2-2 wt % Cr.
7. The coated cutting tool according to claim 1, wherein the Cr/Co ratio in the cemented carbide body is 0.03-0.18.
8. The coated cutting tool according to claim 1, wherein the cemented carbide body further comprises of one or more of metals Me, being Ti, Ta, Nb, V and Zr, in an amount of 50-300 ppm by weight.
9. The coated cutting tool according to claim 8, wherein the cemented carbide body has an atomic percentage ratio Me/Co being lower than or equal to 0.014-(CW_Cr)*0.008 and higher than 0.0005, with Cw_Cr 0.75-0.95, where CW_Cr=(magnetic-% Co+1.13*wt-% Cr)/wt-% Co.
10. The coated cutting tool according to claim 1, wherein the grain size of the WC, d, in the cemented carbide body is 0.20-0.80 µm determined from the value of magnetic coercivity.
11. The coated cutting tool according to any one of claims 1, wherein the thickness of the nanolayered PVD coating is 1-6 µm.
12. The coated cutting tool according to claim 1, wherein the cemented carbide body has a residual stress RScc between −1 and −4 GPa.
13. The coated cutting tool according to claim 1, wherein the PVD coating has a residual stress RSPVD between −0.5 and −4.5 GPa.
14. The coated cutting tool according to claim 13, wherein a difference between the residual stress of the cemented carbide body RScc and the residual stress of the PVD coating RSPVD is such that the difference in absolute value |RScc−RSPVD| is from 0 to 1.5 GPa.

* * * * *